(12) United States Patent
Krummacher

(10) Patent No.: US 7,420,323 B2
(45) Date of Patent: Sep. 2, 2008

(54) ELECTROLUMINESCENT APPARATUS HAVING A STRUCTURED LUMINESCENCE CONVERSION LAYER

(75) Inventor: Benjamin Claus Krummacher, Sunnyvale, CA (US)

(73) Assignee: Osram Opto Semiconductors GmbH, Regensburg (DE)

(*) Notice: Subject to any disclaimer, the term of this patent is extended or adjusted under 35 U.S.C. 154(b) by 0 days.

(21) Appl. No.: 11/264,516

(22) Filed: Oct. 31, 2005

(65) Prior Publication Data

US 2007/0096634 A1 May 3, 2007

(51) Int. Cl.
*H01J 1/62* (2006.01)
*H01J 63/04* (2006.01)

(52) U.S. Cl. .................. 313/502; 313/504; 313/506
(58) Field of Classification Search .......... 313/498–512
See application file for complete search history.

(56) References Cited

U.S. PATENT DOCUMENTS

| | | | |
|---|---|---|---|
| 6,479,930 B1 | 11/2002 | Tanabe et al. | |
| 6,939,189 B2 * | 9/2005 | Wu et al. ................... | 445/24 |
| 2001/0026124 A1 | 10/2001 | Liu et al. | |
| 2001/0030326 A1 | 10/2001 | Reeh et al. | |
| 2001/0033135 A1 * | 10/2001 | Duggal et al. ................ | 313/506 |
| 2002/0063517 A1 | 5/2002 | Hosokawa | |
| 2003/0020399 A1 | 1/2003 | Moller et al. | |
| 2003/0111955 A1 * | 6/2003 | McNulty et al. ............ | 313/504 |
| 2003/0164679 A1 | 9/2003 | Hamano et al. | |
| 2003/0218420 A1 * | 11/2003 | Zovko ........................ | 313/506 |
| 2004/0046497 A1 | 3/2004 | Schaepkens et al. | |
| 2004/0061136 A1 | 4/2004 | Tyan et al. | |
| 2004/0145308 A1 | 7/2004 | Rossner et al. | |
| 2004/0189185 A1 | 9/2004 | Yotsuya | |
| 2004/0212296 A1 * | 10/2004 | Nakamura et al. .......... | 313/504 |
| 2004/0217702 A1 * | 11/2004 | Garner et al. ............... | 313/512 |
| 2005/0023967 A1 | 2/2005 | Gotoh et al. | |
| 2005/0026530 A1 * | 2/2005 | Toguchi et al. ................ | 445/24 |
| 2005/0029513 A1 | 2/2005 | Kawashima et al. | |
| 2005/0142379 A1 | 6/2005 | Juni et al. | |
| 2005/0181232 A1 * | 8/2005 | Ricks et al. ................. | 428/690 |
| 2006/0186802 A1 * | 8/2006 | Cok et al. .................... | 313/506 |
| 2007/0046161 A1 | 3/2007 | Tanabe et al. | |

FOREIGN PATENT DOCUMENTS

| | | |
|---|---|---|
| EP | 0 973 358 A2 | 1/2000 |
| JP | 2001-148287 | 5/2001 |

(Continued)

OTHER PUBLICATIONS

Anil R. Duggal, et al., "Organic Light-Emitting Devices for Illumination Quality White Light", May 13, 2002, Applied Physics Letters, vol. 80, No. 19, 3470-3472 pp.

(Continued)

*Primary Examiner*—Karabi Guharay
*Assistant Examiner*—Bumsuk Won
(74) *Attorney, Agent, or Firm*—Fish & Richardson P.C.

(57) ABSTRACT

An apparatus such as a light source is disclosed which has an OLED device and a structured luminescence conversion layer disposed on the substrate or transparent electrode of said OLED device and on the exterior of said OLED device. The structured luminescence conversion layer contains color-changing and non-color-changing regions arranged in a particular pattern.

19 Claims, 3 Drawing Sheets

FOREIGN PATENT DOCUMENTS

WO    WO 2004/040661 A2    5/2004

OTHER PUBLICATIONS

A Niko et al., "Red-green-blue emission or paranexaphenyl devices with color-converting media", Nov. 1997, Journal of Applied Physics, vol. 82, No. 9, pp. 4177-4182.

Shigeo Shinoya et al., "Phosphor Handbook", 1999, CRC Press LLC, pp. 736-738.

J. J. Shiang et al., "Application of radiative transport theory to light extraction from organic light emitting diodes", Mar. 1, 2004, Journal of Applied Physics, vol. 95, No. 5, pp. 2880-2888.

W. H. Melhuish, "Quantum Efficiencies of Fluorescence of Organic Substances Effect of Solvent and Concentration of the Flourescent Solute", Feb. 1961, Journal of Phys. Chem. 65, pp. 229-235.

International Search Report and Written Opinion of the International Search Authority, International Application Serial No. PCT/EP2006/004777, Sep. 21, 2006, 9 pp.

* cited by examiner

ELECTROLUMINESCENT APPARATUS HAVING A STRUCTURED LUMINESCENCE CONVERSION LAYER

GOVERNMENT RIGHTS

This invention was made with Government support under Contract No. DE-FC26-04NT41947 awarded by the Department of Energy. The Government may have certain rights in the invention.

BACKGROUND

Display and lighting systems based on LEDs (Light Emitting Diodes) have a variety of applications. Such display and lighting systems are designed by arranging a plurality of photo-electronic elements ("elements") such as rows of individual LEDs. LEDs that are based upon semiconductor technology have traditionally used inorganic materials, but recently, the organic LED ("OLED") has become a potential substitute. Examples of other elements/devices using organic materials include organic solar cells, organic transistors, organic detectors, and organic lasers.

An OLED is typically comprised of two or more thin organic layers (e.g., an electrically conducting organic layer and an emissive organic layer which emits light) which separate an anode and a cathode layer. Under an applied forward potential, the anode injects holes into the stack of organic layers, while the cathode injects electrons. The injected holes and electrons each migrate (under the influence of an externally applied electric field) toward the opposite electrode and recombine in the emissive layer under emission of a photon. Similar device structure and device operation applies for OLEDs consisting of small molecule organic layers and/or polymeric organic layers. Each of the OLEDs can be a pixel element in a passive/active matrix OLED display or an single element used as a general area light source and the like. The construction of OLED light sources and OLED displays from individual OLED elements or devices is well known in the art. The displays and light sources may have one or more common layers such as common substrates, anodes or cathodes and one or more common organic layers sandwiched in between. They may also consist of photo-resist or electrical separators, bus lines, charge transport and/or charge injection layers, and the like. Typically, a transparent or semi-transparent glass substrate is used in bottom-emitting OLED devices.

The quality of lighting is given by the color rendering index (CRI) of the light source. The CRI is a measurement of the light source (lighting device) to render all the colors of the object under illumination. The CRI depends on the normalized output spectrum of a lighting device. For many applications, light sources, which emit light in the short wave range, are coated with one or more layers of luminescence converting materials (down-conversion layers) to form a higher CRI light source compared to the uncoated light source.

A color changing material (CCM) coated on a light source absorbs a part of photons emitted by the light source and emits them at a different wave length. A color-changing material is defined herein as a material which absorbs photons related to lower wavelength and re-emits all of them or a part of them (depending on the quantum yield of the CCM) at higher wavelengths. The non-absorbed fraction of the photons emitted by the light source and the photons emitted by the phosphor constitute the output spectrum of the coated device.

For lighting applications, cerium doped garnets, nitride phosphors, ionic phosphors like $SrGa_2S_4:Eu^{2+}$ or $SrS:Eu^{2+}$, fluorescent dyes, quantum dots or conjugated polymers are often used as luminescence converting materials. In most applications, these materials are dissolved or embedded in a transparent matrix, for example polycarbonate, silicone, epoxy or PMMA (polymethylmetharcylate). The matrix containing the phosphor is often directly coated on the light source or used as material of the device housing.

The disadvantage of conventional uniform coatings is explained by the following example. For instance, consider one or more uniform down-conversion layers on top of a flat light source. The light output of the light source is below the photon saturation limit of the down-conversion layer(s). In this case the shape of the output spectrum of the device is only adjusted by the thickness value(s) of the layer(s) and the concentration(s) of the phosphor(s) in the matrix. The multitude of all possible output spectra is given by the variation of these concentrations or thickness values. Thus, there is limited flexibility in designing output spectra.

DETAILED DESCRIPTION

Figure 1:
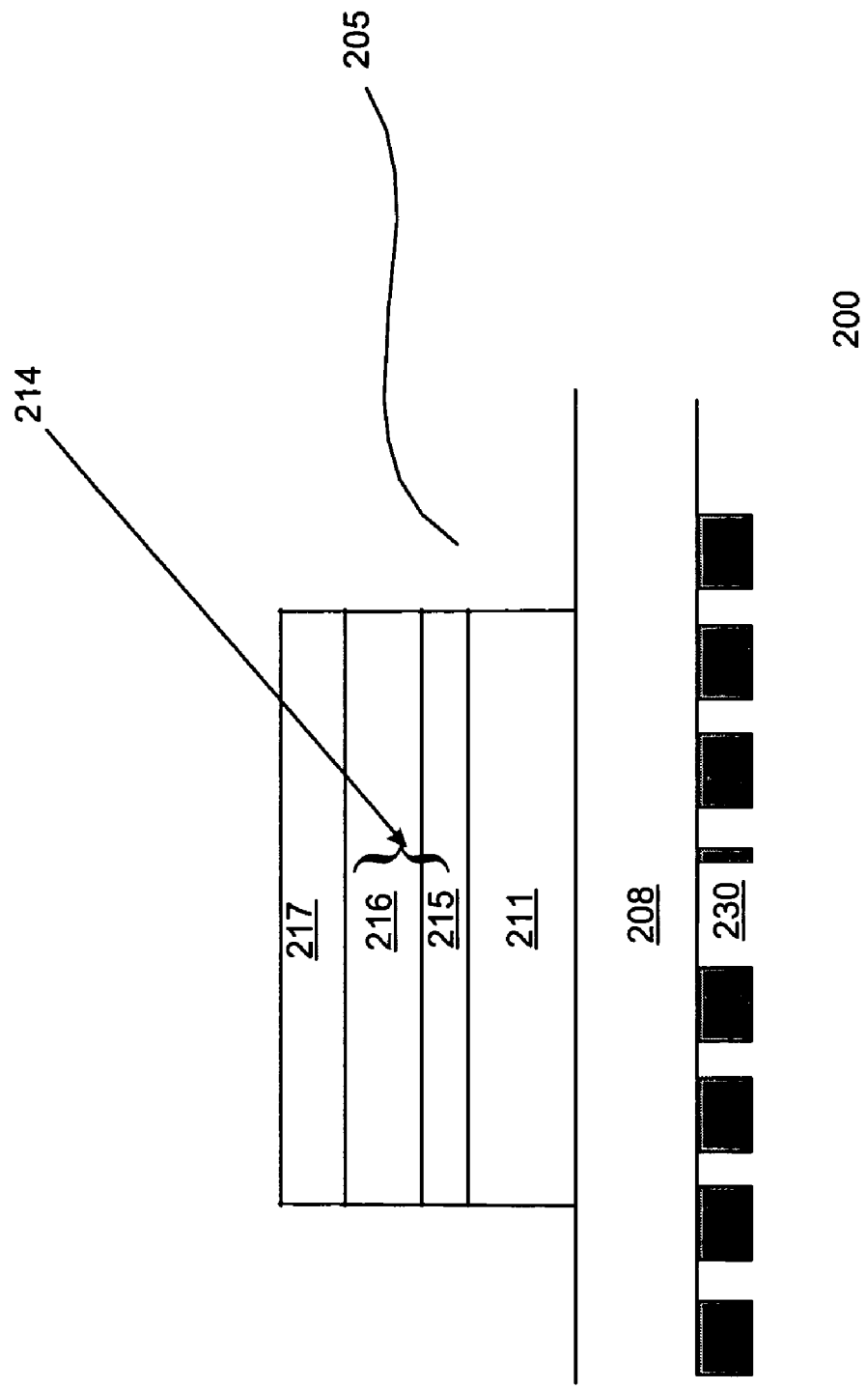
FIG. 1 shows a cross-sectional view of an embodiment of an electroluminescent (EL) apparatus 200 according to at least one embodiment of the invention.

In at least one embodiment of the invention, an electroluminescent (EL) apparatus is disclosed which utilizes 1) an OLED device or light source including a transparent layer for light emission; and 2) a structured luminescence conversion layer disposed in the path of light emission from the OLED device or light source and on the outside of the OLED device on the exterior side of the transparent layer. The structure of the structured luminescence conversion layer in accordance with various embodiments of the invention may be striped, cross-striped (meshed), circular, square (checkered) or any geometry in configuration.

The structured luminescence conversion layer comprises color-changing regions and non-color-changing regions. The various color-changing regions are separated by the various non-color-changing regions. The non-color-changing regions may be completely empty or may comprise of a non-absorbing, light emitting or light transmitting material (such as glass) which does not significantly alter or re-emit the incident light in a different spectrum. The color-changing regions will each comprise of a color changing material (such as a phosphor) which is defined herein as a material which can absorb light in one spectrum and emit light in another spectrum. The color-changing materials within the color-changing regions may be embedded in a transparent matrix. All of the color-changing regions in the structured luminescence conversion layer can be of the same material or can be different material. For instance, one portion of the color-changing regions may be orange emitting while another portion is yellow emitting. The ratio of the color-changing regions versus non-color-changing regions affects the output spectrum of the EL apparatus. Due to the addition of this ratio, the use of a structured conversion layer gives greater flexibility in designing the output spectra than when uniform conversions layers are used. The flexibility enables finding a better compromise between efficiency and color rendering.

According to a model described in A. R. Duggal, J. J. Shiang, C. M. Heller, D. F. Foust, Applied Physics Letters 80, 19 (2002), the output spectrum of an EL apparatus with a uniform down conversion or color-changing material layer is given by:

$$A_{\alpha,\delta}(\lambda) = S_0(\lambda)\exp[-\alpha_1(\lambda)\delta] + W_{\alpha,\delta}C_{\alpha,\delta}(\lambda)P(\lambda) \quad (1),$$

where $\alpha(\lambda)$ is the absorption coefficient of the conversion layer related to the color-changing material concentration, $\delta$ is the effective optical path length related to the thickness of the coating. $P(\lambda)$ is normalized so that its integral over all wavelength is unity. $W_{\alpha,\delta}$ is a weight factor. C is the self absorption correction. $S_0(\lambda)$ is the emission spectrum of the light source.

Based on the rules of color mixing, the output spectrum of an identical EL apparatus with a structured luminescence conversion layer in accordance with the invention is given by:

$$B_{\alpha,\delta,x}(\lambda) = (1-x)S_0(\lambda) + x\{S_0(\lambda)\exp[-\alpha(\lambda)\delta] + W_{\alpha,\delta}C_{\alpha,\delta}(\lambda)P(\lambda)\} \quad (2),$$

where x (=0 . . . 1) are the color-changing regions, and (1−x) are the non-color-changing regions of the structured luminescence conversion layer.

The weight factor $W_{\alpha,\delta}$ is given by:

$$W_{\alpha,\delta} = Q\int S_0(\lambda)(1-\exp[-\alpha(\lambda)\delta])d\lambda,$$

where Q is the quantum yield of the color-changing material used in the color-changing regions.

The self absorption correction $C_{\alpha,\delta}(\lambda)$ is given by:

$$C_{\alpha,\delta}(\lambda) = \exp[-\alpha(\lambda)\delta]/(1-Q\int P(\lambda)(1-\exp[-\alpha(\lambda)\delta]d\lambda.$$

The above assumes effective path length for the absorption process is equal to the effective path length for the luminescence. As a result of the model described in equation 2 above, the differentiation between color-changing regions (given by the multiplier x) and non-color-changing regions (given by the multiplier 1−x) enables a greater ability to tune the output spectra more precisely.

Preferably, the color-changing material(s) selected for inclusion in the color-changing regions of the structured luminescence conversion layer are such that the light output of the EL apparatus is below the photon saturation limit of the structured conversion layer. In alternate embodiments, the photon saturation limit may even be exceeded. The structured luminescence conversion layer can be fabricated by screen printing, inkjet printing, scratching, doctor blading, photolithography, and so on.

FIG. 1 shows a cross-sectional view of an embodiment of an electroluminescent (EL) apparatus 200 according to at least one embodiment of the invention. The EL apparatus 200 includes an OLED device 205 and a structured luminescence conversion layer 230. OLED device 205 includes substrate 208 and a first electrode 211 on the substrate 208. The first electrode 211 may be patterned for pixilated applications or un-patterned for backlight or other general lighting applications. The OLED device 205 also includes a semiconductor stack 214 on the first electrode 211. The semiconductor stack 214 includes at least the following: (1) an anode buffer layer (ABL) 215 and (2) an active light emitting layer (EML) 216.

As shown in FIG. 1, the OLED device 205 is a bottom-emitting device. As a bottom-emitting device, the first electrode 211 acts as an anode, and the ABL 215 is deposited onto the first electrode 211, and the EML 216 is deposited onto the ABL 215. Finally, the OLED device 205 also includes a second electrode 217 deposited onto the organic semiconductor stack 214. Other layers than that shown in FIG. 1 may also be added such as insulating layers, barrier layers, electron/ hole injection and blocking layers, getter layers, and so on. In accordance with the invention, a structured luminescence conversion layer 230 is disposed on the outside of the OLED device 205. More specifically, in the configuration shown, the structured luminescence conversion layer 230 is disposed on the substrate 208. The OLED device 205 and the structured luminescence conversion layer 230 together comprise the EL apparatus 200. Exemplary embodiments of these layers are described in greater detail below.

Substrate 208:

The substrate 208 can be any material, which can support the additional layers and electrodes, and is transparent or semi-transparent to the wavelength of light emitted by the OLED device 205. Preferable substrate materials include glass, quartz, and plastic, preferably, thin, flexible glass. The preferred thickness of the substrate 208 depends on the material used and on the application of the device. The substrate 208 can be in the form of a sheet or continuous film. The continuous film is used, for example, for roll-to-roll manufacturing processes which are particularly suited for plastic, metal, and metallized plastic foils.

First Electrode 211:

In the bottom-emitting configuration, the first electrode 211 functions as an anode (the anode is a conductive layer which serves as a hole-injecting layer). Typical anode materials include metals (such as platinum, gold, palladium, indium, and the like); conductive oxides (such as lead oxide, tin oxide, indium-tin oxide (ITO), and the like); graphite; and doped conducting polymers (such as polyaniline, polypyrrole, polythiophene, and the like). Preferably, the first electrode 211 is comprised of indium-tin oxide (ITO).

For OLEDs, the first electrode layer 211 is usually thin enough so as to be semi-transparent and allow at least a fraction of light to transmit through (in bottom emitting OLEDs). The thickness of the first electrode 211 is from about 10 nm to about 1000 nm, preferably, from about 50 nm to about 200 nm, and more preferably, is about 100 nm. As such, any thin-film deposition method may be used in the first electrode fabrication step. These include, but are not limited to, vacuum evaporation, sputtering, electron beam deposition, chemical vapor deposition, etching and other techniques known in the art and combinations thereof. The process also usually involves a baking or annealing step in a controlled atmosphere to optimize the conductivity and optical transmission of anode layer. Photolithography can then be used to define any pattern, if desired, upon the first electrode 211.

ABL 215:

The ABL 215 has good hole conducting properties and is used to effectively inject holes from the first electrode 211 to the EML 216. The ABL 215 is made of polymers or small molecule materials or other material. For example, the ABL 215 can be made from tertiary amine or carbazole derivatives both in their small molecule or their polymer form, conducting polyaniline ("PANI"), or PEDOT:PSS (a solution of poly (3,4-ethylenedioxythiophene) ("PEDOT") and polystyrenesulfonic acid ("PSS") (available as Baytron P from HC Starck). The ABL 215 can have a thickness from about 5 nm to about 1000 nm, and is conventionally used from about 50 to about 250 nm. Other examples of the ABL 215 include copper phthalocyanine (CuPc) films with preferred thicknesses between 10 and 50 nm.

The ABL 215 can be formed using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating.

EML 216:

The active light emitting layer (EML) 216 is comprised of an organic electroluminescent material which emits light upon application of a potential across first electrode 211 and second electrode 217. The EML may be fabricated from materials organic or organo-metallic in nature, and may include polymer, monomer and/or small molecule emitters. As used herein, the term organic also includes organo-metallic materials. Light-emission in these materials may be generated as a result of fluorescence and/or phosphorescence.

Organic materials may comprise of one or more of a polymer, polymer blend, monomer, oligomer, co-polymer, an organic side-group, small molecule or blend of any of these. The EML 216 can comprise of, for example, conjugated EL polymers, such as polyfluorenes, polythiophenes, polyphenylenes, polythiophenevinylenes, polyspiro polymers, or poly-p-phenylenevinylenes or their families, copolymers, derivatives, blends, or mixtures thereof that emit white, red, blue, yellow, orange, green or any single or combined spectrum of light.

The EML 216 can be a continuous film that is non-selectively deposited (e.g. spin-coating, dip coating etc.) or discontinuous regions that are selectively deposited (e.g. by ink-jet printing). EML 216 may also be fabricated by vapor deposition, sputtering, vacuum deposition etc. as desired.

The EML 216 can be composed of more than one light emitting element (for instance, a host and dopant). In the case of two light-emitting elements, the relative concentration of the host element and the dopant element can be adjusted to obtain the desired color. The EML 216 can emit light in any desired color and be comprised of polymers, co-polymers, dopants, quenchers, and hole and electron transport materials as desired. For instance, the EML 216 can emit light in blue, red, green, orange, yellow or any desired combination of these colors and in some applications, may include a combination of emitting elements which produce white light. The EML 216 may also comprise a plurality of separate emissive sub-layers.

In addition to active electroluminescent materials that emit light, EML 216 can also include materials capable of charge transport. Charge transport materials include polymers or small molecules that can transport charge carriers. For example, organic materials such as polythiophene, derivatized polythiophene, oligomeric polythiophene, derivatized oligomeric polythiophene, pentacene, triphenylamine, and triphenyldiamine.

Second Electrode 217:

In the bottom-emitting configuration, the second electrode 217 functions as the cathode (i.e. as the conductive layer which serves as an electron-injecting layer and which is comprised of a material with a low work function). While many materials, which can function as a cathode, are known to those of skill in the art, most preferably a composition that includes aluminum, indium, silver, gold, magnesium, calcium, lithium, lithium fluoride, cesium fluoride, sodium fluoride, and barium, or combinations thereof, or alloys thereof, is utilized. Aluminum, and combinations of calcium and aluminum, barium and aluminum, lithium fluoride and aluminum, lithium fluoride with calcium and aluminum, magnesium and silver or their alloys are especially preferred.

Preferably, the thickness of second electrode 423 is from about 10 nm to about 1000 nm, more preferably from about 50 nm to about 500 nm, and most preferably from about 100 nm to about 300 nm. While many methods are known to those of ordinary skill in the art by which the first electrode material may be deposited, vacuum deposition methods, such as thermal vacuum evaporation, sputtering or electron-beam deposition are preferred. Other layers (not shown) such as a barrier layer and getter layer may also be used to protect the electronic device. Such layers are well-known in the art and are not specifically discussed herein.

Structured Luminescence Conversion Layer 230

OLED device 205 as shown is a bottom-emitting OLED, and thus, the light emitted from the EML 217 passes through the substrate 208. In accordance with various embodiments of the invention, a structured luminescence conversion layer 230 is disposed on the exposed external side of the substrate 208 (and thus, on the exterior of the OLED device 205) to modify and tune the light output from EL apparatus 200. In at least one embodiment of the invention, the structured luminescence conversion layer is composed of color-changing regions and non-color-changing regions. The color-changing regions together form a pattern or "structure" for the structured luminescence conversion layer 230 which is distinguishable from uniform down conversion layers (where the entire layer has color-changing materials) used in conventional electroluminescent devices. The structure of the structured luminescence conversion layer in accordance with various embodiments of the invention may be striped, cross-striped (meshed), circular, square (checkered) or any geometry in configuration. Exemplary structures are illustrated in FIGS. 3A, 3B, 3C and 3D.

The various color-changing regions are separated by the various non-color-changing regions. The non-color-changing regions may be completely empty or may comprise of a non-absorbing, light emitting or light transmitting material (such as glass). The color-changing regions will each consist of a fluoresecent or phosphorescent material or any color changing material which can absorb light in one spectrum and emit light in another spectrum. The color-changing materials within the color-changing regions may be embedded in a transparent matrix. All of the color-changing regions in the structured luminescence conversion layer can be of the same material or can be different material. For instance, one portion of the color-changing regions may be orange emitting while another portion is yellow emitting. The ratio of the color-changing regions versus non-color-changing regions affects the output spectrum of the EL apparatus. Due to the addition of this ratio, the use of a structured conversion layer gives greater flexibility in designing the output spectra than when uniform conversions layers are used. The flexibility enables finding a better compromise between efficiency and color rendering.

Exemplary color-changing materials which could be used in forming the color-changing regions include, but are not limited to, organic and inorganic dyes, cerium doped garnets, nitride phosphors, ionic phosphors like $SrGa_2S_4:Eu^{2+}$ or $SrS:Eu^{2+}$, quantum dots, fluorescent dyes or conjugated polymers. The color-changing material in each case can be dissolved or blended into transparent matrix materials such as silicone, epoxy, adhesives, polymethylmethacrylate, polycarbonate and so on.

The thickness of the structured luminescence conversion layer 230 depends on the desired output spectrum of the device and the concentration of the CCM (color-changing material) in the luminescence conversion layer. The concentration of the CCM may be limited by quenching and aggregation effects. Furthermore, scattering effects are dependent on the concentration of the CCM. In some embodiments, the luminescence conversion layer 230 can be attached to the substrate 208 using an optically adhesive glue, which may additionally also be curable by ultraviolet radiation, or an index matching gel. In other embodiments, the microstructured film 230 can be deposited or formed directly on substrate 208 by screen printing, inkjet printing or other selective deposition techniques or masking combined with non-selective deposition techniques. Further, the structured conversion layer 230 can utilize a cross-linkable material which can then be chemically bonded to the substrate 208.

Figure 2:
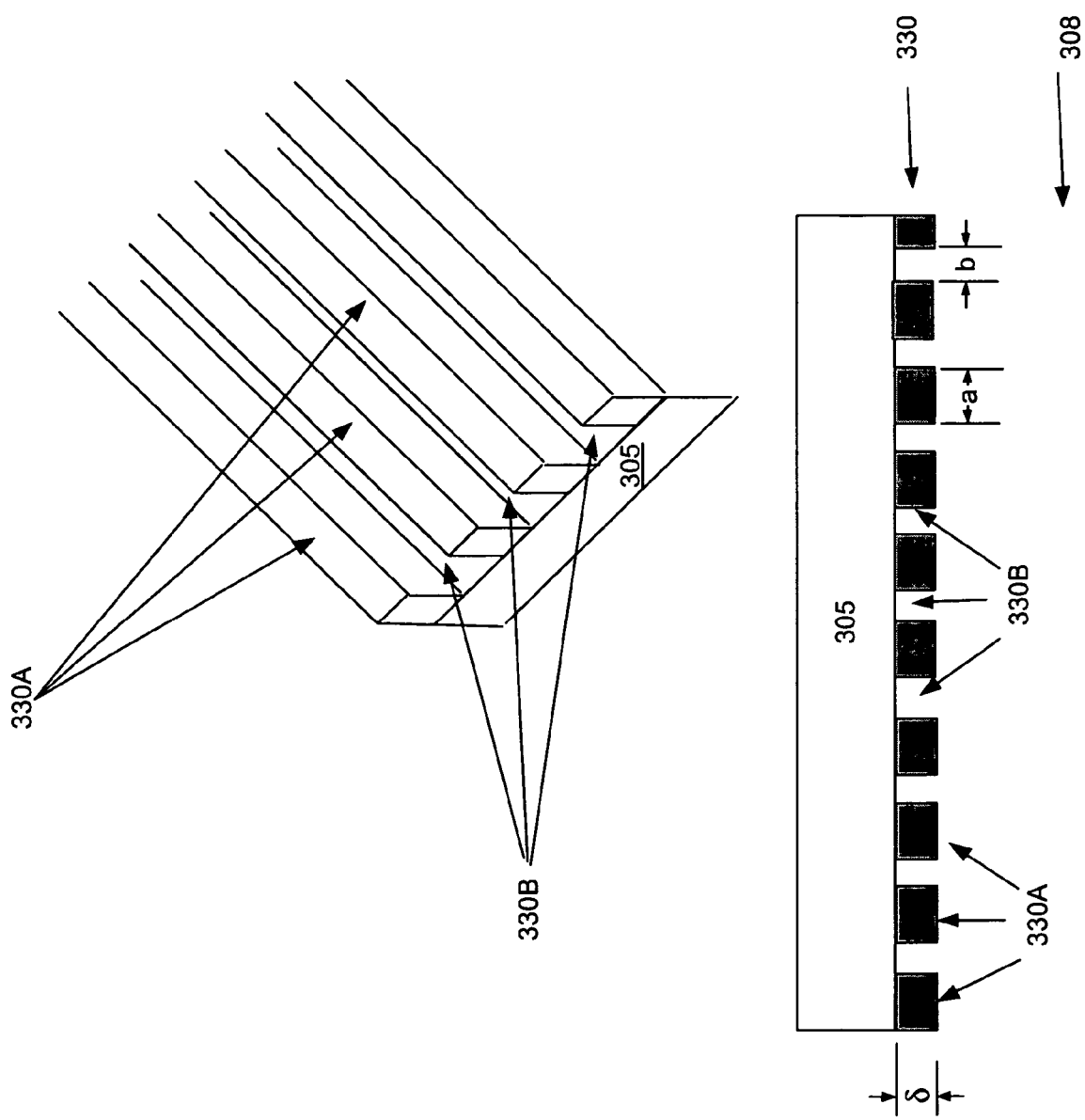
FIG. 2 shows a cross-sectional view of exemplary EL apparatus in accordance with at least one embodiment of the invention.

FIG. 2 shows a cross-sectional view of exemplary EL apparatus in accordance with at least one embodiment of the invention. EL apparatus 308 comprises a light source 305 and a structured luminescence conversion layer 330. Layer 330 has a plurality of color-changing regions 330A and non-color-changing regions 330B. The non-color-changing regions 330B are shown as empty regions. The width of the non-color-changing regions is "b" while the width of the color-changing regions is "a". The ratio between "a" and "b" would determine the output spectrum as described in equation 2 above (where "b" is 1−x and "a" is x). In reference to equation 2, the thickness of the structured luminescence conversion layer 330 is $\delta$. As shown, the thickness is uniform over the structured luminescence conversion layer 330, however, in other embodiments, the thickness may be varied from one color-changing region to another or varied within even a given color-changing region. The equation 2 above assumes a uniform thickness value $\delta$. The color-changing regions 330A absorb a certain spectra of light emitted from light source 305 and emit another spectra of light. The non-color-changing regions 330B pass through the light emitted from light source 305 without spectral modification. The non-color-changing regions 330B may also be comprised of an actual material rather than an empty or void space. For instance, the non-color-changing regions 330B may comprise an optical adhesive or glass or similar light transmissive material.

Figure 3A:
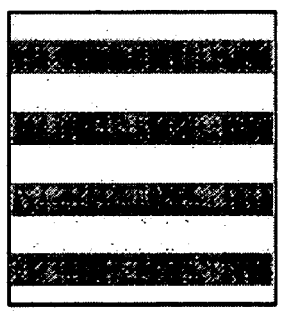
FIGS. 3A-3D illustrates exemplary patterns for structured luminescence conversion layers from a top view.
Figure 3B:
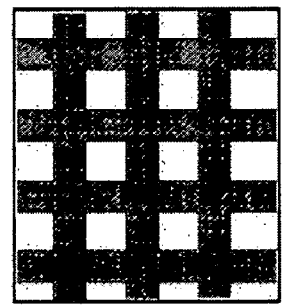
Figure 3C:
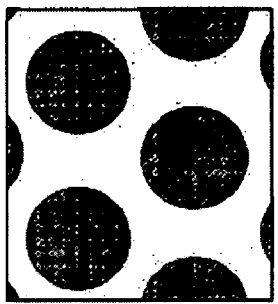
Figure 3D:
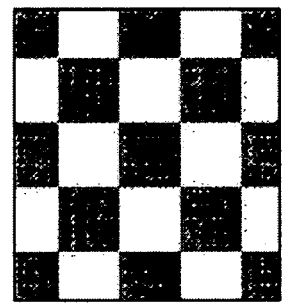

FIGS. 3A-3D illustrates exemplary patterns for structured luminescence conversion layers from a top view. FIG. 3A shows a striped pattern or structure for the structured luminescence conversion layer. The color-changing regions are shaded while the non-color-changing regions are blank. This pattern would correspond, for instance, to the cross-sectional view of the structured luminescence conversion layer 330 shown in FIG. 2. FIG. 3B shows a mesh pattern/structure where color-changing regions are stripes overlap one another. In this case, the non-color-changing regions are square in geometry (from a top view). FIG. 3C shows a circular pattern/structure for the color-changing regions. One example of this pattern would be cylindrical color-changing regions or color-changing regions formed by deposition which dries into a drop shaped film. FIG. 3D shows a checkered pattern/structure where color-changing and non-color-changing regions alternate in squares. The patterns shown in FIGS. 3A-3D are merely exemplary of the possible patterns or structures for the structured luminescence conversion layer and are not intended to be limiting or exhaustive. Though shown in repeating patterns, the structured luminescence conversion layer may also have random or non-repeating or partially repeating color-changing and non-color-changing regions. Furthermore, as mentioned above the thicknesses of color-changing regions as compared to one another may vary. Also, the thickness of single discrete color-changing region across its width may vary. For example, a color-changing region that is the result of a dried solution drop will be thicker in certain places (for instance in the center of the drop) and likely less thick towards the outer edges.

Top Emitting OLED Devices

In an alternative configuration to that shown in FIG. 1 and described above, the first electrode 211 functions as a cathode (the cathode is a conductive layer which serves as an electron-injecting layer and which comprises a material with a low work function). The cathode, rather than the anode, is deposited on the substrate 208 in the case of a top-emitting OLED. In this alternative configuration, the second electrode layer 217 functions as an anode (the anode is a conductive layer which serves as a hole-injecting layer and which comprises a material with work function greater than about 4.5 eV). The anode, rather than the cathode, is deposited on the semiconductor stack 214 in the case of a top-emitting OLED.

In embodiments where the OLED is "top-emitting" as discussed above, the anode may be made transparent or translucent to allow light to pass from the semiconductor stack 214 through the top of the device. In such cases, the structured luminescence conversion layer would be attached, bonded or cured to the anode 217 (or to a glass or other material which encapsulates and protects the anode) rather than to the substrate 208 as with a bottom-emitting OLED shown in FIG. 1.

The OLED lighting sources and displays produced from a combination or arrays of EL devices described earlier can be used within applications such as information displays, general, industrial and area lighting, telephones, printers, computer displays, televisions, and illuminated signs.

As any person of ordinary skill in the art of light-emitting device fabrication will recognize from the description, figures, and examples that modifications and changes can be made to the embodiments of the invention without departing from the scope of the invention defined by the following claims.

What is claimed:

1. An electroluminescent apparatus, comprising:
a light source comprising a transparent layer capable of at least partially transmitting light out from said light source; and
a structured luminescence conversion layer disposed over said transparent layer and on the exterior of said light source, said structured luminescence conversion layer comprising color-changing regions and non-color-changing regions, said color-changing regions absorbing a first spectrum of light from said light source and emitting a second spectrum of light, said non-color-changing regions allowing the light to pass through as a non-absorbed spectrum of light, the second spectrum of light combining with the non-absorbed spectrum of light to give a total output spectrum of light for said electroluminescent apparatus;
wherein the luminescence conversion layer is structured in a cross-striped, circular or square-checkered pattern.

2. The apparatus of claim 1 wherein said non-color-changing regions are void of material.

3. The apparatus of claim 1 wherein said structured luminescence conversion layer comprises of at least one dye.

4. The apparatus of claim 3 wherein said dye is fluorescent.

5. The apparatus of claim 3 wherein said dye is organic.

6. The apparatus of claim 3 wherein said dye is phosphorescent.

7. The apparatus of claim 1 wherein said structured luminescence conversion layer comprises a transparent matrix material.

8. The apparatus of claim 7 wherein said transparent matrix material is at least one of silicone, epoxy, polymethylmethacrylate and polycarbonate.

9. The apparatus of claim 1 wherein said luminescence conversion layer is attached physically and/or chemically to said transparent layer.

10. The apparatus of claim 1 wherein said device is part of light source application.

11. The apparatus of claim 1 wherein said light source is an OLED device.

12. The apparatus of claim 1 wherein said transparent layer is an anode layer of said light source.

13. The apparatus of claim 1 wherein said transparent layer is a substrate.

14. The apparatus of claim 1 wherein said non-color-changing regions comprise a non-absorbing, light transmissive material.

15. The apparatus of claim 14 wherein said non-color-changing regions comprise of at least one of: glass, polycarbonate, or polymethylmethacrylate.

16. The apparatus of claim 1 wherein the ratio of the total area of all said color-changing regions to the total area of all said non-color-changing regions affects said total output spectrum of said apparatus.

17. The apparatus of claim 1 wherein said color-changing regions include at least one of an organic dye, an inorganic dye, perylene, coumarin, a cerium doped garnet, a nitride phosphor, an ionic phospor, a fluorescent dye, quantum dots or a conjugated polymer.

18. An electroluminescent apparatus, comprising:
a light source comprising a transparent layer capable of at least partially transmitting light out from said light source; and
a structured luminescence conversion layer disposed over said transparent layer and on the exterior of said light source, said structured luminescence conversion layer comprising color-changing regions and non-color-changing regions, said color-changing regions absorbing a first spectrum of light from said light source and emitting a second spectrum of light, said non-color-changing regions allowing the light to pass through as a non-absorbed spectrum of light, the second spectrum of light combining with the non-absorbed spectrum of light to give a total output spectrum of light for said electroluminescent apparatus, wherein a first color changing region has a thickness different from a thickness of a second color-changing region of the color-changing regions or wherein a thickness of a first color changing region of the color changing regions varies within the first color-changing region.

19. An electroluminescent apparatus, comprising:
a light source comprising a transparent layer capable of at least partially transmitting light out from said light source; and
a structured luminescence conversion layer disposed over said transparent layer and on the exterior of said light source, said structured luminescence conversion layer comprising color-changing regions and non-color-changing regions, said color-changing regions absorbing a first spectrum of light from said light source and emitting a second spectrum of light, said non-color-changing regions allowing the light to pass through as a non-absorbed spectrum of light, the second spectrum of light combining with the non-absorbed spectrum of light from to give a total output spectrum of light for said electroluminescent apparatus, wherein the non-color-changing region of the structured luminescence conversion layer includes glass.

* * * * *

UNITED STATES PATENT AND TRADEMARK OFFICE
CERTIFICATE OF CORRECTION

PATENT NO.         : 7,420,323 B2
APPLICATION NO. : 11/264516
DATED              : September 2, 2008
INVENTOR(S)        : Benjamin Claus Krummacher It is certified that error appears in the above-identified patent and that said Letters Patent is hereby corrected as shown below:

Column 9, Line 18 at Claim 17; replace:
"phosphor, an ionic phospor, a fluorescent dye, quantum dots" with
-- phosphor, an ionic phosphor, a fluorescent dye, quantum dots --

Column 10, Line 25 at Claim 19; replace:
"from to give a total output spectrum of light for said" with
-- to give a total output spectrum of light for said --

Signed and Sealed this

Tenth Day of February, 2009

JOHN DOLL
*Acting Director of the United States Patent and Trademark Office*